(12) United States Patent
Hwang et al.

(10) Patent No.: US 7,361,433 B2
(45) Date of Patent: Apr. 22, 2008

(54) PHOTOMASK FOR FORMING PHOTORESIST PATTERNS REPEATING IN TWO DIMENSIONS AND METHOD OF FABRICATING THE SAME

(75) Inventors: Chan Hwang, Seoul (KR); In-Sung Kim, Suwon (KR); Young-Seog Kang, Yongin (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 655 days.

(21) Appl. No.: 10/827,556

(22) Filed: Apr. 19, 2004

(65) Prior Publication Data
US 2005/0003278 A1    Jan. 6, 2005

(30) Foreign Application Priority Data
Jul. 4, 2003    (KR) ...................... 10-2003-0045446

(51) Int. Cl.
G03F 1/00    (2006.01)

(52) U.S. Cl. ......................................................... 430/5
(58) Field of Classification Search .................. 430/5, 430/22, 322–324; 716/19–21
See application file for complete search history.

(56) References Cited

U.S. PATENT DOCUMENTS

| 5,935,734 | A  | * | 8/1999  | Pierrat ............................ 430/5 |
| 6,830,852 | B2 | * | 12/2004 | Kawata et al. .................. 430/5 |
| 6,991,896 | B2 | * | 1/2006  | Kawashima ................. 430/394 |
| 7,022,438 | B2 | * | 4/2006  | Kim ............................... 430/5 |

* cited by examiner

*Primary Examiner*—S. Rosasco
(74) *Attorney, Agent, or Firm*—F.Chau & Associates, LLC

(57) ABSTRACT

A photomask includes a transparent substrate, and a plurality of light-shielding patterns repeatedly aligned on the transparent substrate in two dimensions. Each of the light-shielding patterns has length and width measurements that differ from each other. Further, the photomask includes at least one through hole penetrating a portion of each of the light-shielding patterns to expose the transparent substrate.

18 Claims, 3 Drawing Sheets

PHOTOMASK FOR FORMING PHOTORESIST PATTERNS REPEATING IN TWO DIMENSIONS AND METHOD OF FABRICATING THE SAME

CROSS-REFERENCE TO RELATED APPLICATION

This application claims the benefit of Korean Patent Application No. 2003-45446, filed Jul. 4, 2003, the disclosure of which is hereby incorporated by reference in its entirety.

BACKGROUND

1. Technical Field

The present disclosure relates to a photomask and a method of fabricating the same, and more particularly, to a photomask for forming patterns repeating in two dimensions, and a method of fabricating the same.

2. Discussion of Related Art

Semiconductor devices are becoming more highly integrated by the use of finer fabrication techniques. Photoresist patterns must have a smaller critical dimension (CD) than the wavelength of irradiated light used for pattern formation to maintain the trend of increasing integration. Further, to satisfy CD requirements, the fabrication process for the photoresist patterns must provide a high resolution and an improved depth of focus (DOF) margin.

An off-axis illumination technique is widely used as a method to improve the resolution and the DOF margin. The off-axis illumination technique exposes a photoresist layer by selecting an appropriate illumination in accordance with the patterns on a photomask and adjusting the angle of an incident light to the photomask. The selection of an appropriate illumination is of great importance in the off-axis illumination technique to form a desired photoresist pattern.

U.S. Pat. No. 6,361,909 to Gau et al, entitled "ILLUMINATION APERTURE FILTER DESIGN USING SUPERPOSITION", describes a technique to provide the design of an optimum illumination aperture through individual analysis for the optimum CD and DOF conditions. The technique is easily employed for line/space patterns or patterns having an identical pitch in terms of axes or directions, but as for two dimensional patterns having different pitches, it is difficult to select an appropriate illumination.

FIG. 1 is a plane view illustrating a conventional photomask for forming patterns repeating in two dimensions and having axes with different pitches.

Referring to FIG. 1, light-shielding patterns 20 are repeated two dimensionally on a transparent substrate 10. Each of the light-shielding patterns 20 has a length and a width that differ from each other in measurement. The length of each light-shielding pattern in a longitudinal axis L is longer than the length thereof in a short axis S. The length measured from a center point between a pair of light-shielding patterns 20 to a center point between an adjacent pair of light-shielding patterns 20 in the longitudinal axis L is defined as a longitudinal pitch $P_l$. Further, the length measured from a center point of one light-shielding pattern to a center point of an adjacent light-shielding pattern in the short axis S is defined as a short pitch $P_s$. The pitch $P_l$ in the longitudinal axis L is greater than the pitch $P_s$ in the short axis S.

A pitch in the light-shielding pattern is a factor used to determine a diffraction angle. The diffraction angle (θ) is given by Equation 1.

$$\sin \theta = \lambda/P \quad \text{[Equation 1]}$$

where λ is the wavelength of an incident light, and P is the pitch.

Once can see from Equation 1 that, in a repeating pattern, the longer the pitch, the smaller the diffraction angle.

In patterns repeating in two dimensions, the respective pitches in the longitudinal axis L and in the short axis S are different so that the diffraction angle varies in accordance with each direction. Therefore, it is difficult to select an illumination suitable for transferring the photomask on a photoresist layer.

The distances between the light-shielding patterns 20 in the longitudinal axis L or in the short axis S represent a critical dimension (CD). That is, the minimum length between the light-shielding patterns 20 either in the longitudinal axis L or in the short axis S is a critical dimension (CD).

For convenience of explanation, the distances between the light-shielding patterns in the longitudinal axis L and the distances between photoresist patterns corresponding to the light-shielding patterns in the longitudinal axis L are defined as a longitudinal CD (CDL), and the distances between the light-shielding patterns in the short axis S and the distances between photoresist patterns corresponding to the light-shielding patterns in the short axis S are defined as a short CD (CDS).

The pitch $P_l$ in the longitudinal axis L is small relative to the length of the light-shielding patterns in the longitudinal axis L, and thus, a duty ratio, which represents a ratio of a width of the pattern relative to a pitch, is very high. If the duty ratio is high, the image sharpness of the light-shielding patterns transferred on the photoresist is reduced.

Generally, light-shielding patterns on a transparent substrate have a standard deviation associated with a desired CD, and photoresist patterns also have a standard deviation associated with a desired CD. Therefore, the light-shielding patterns need to have an allowable CD. The allowable CD is determined by a mask error enhancement factor (MEEF), which has a direct relationship with the allowable CD. In the case that the light-shielding patterns cannot be formed with a small CD due to a large MEEF, it will be difficult to form photoresist patterns with a desired CD. Therefore, in order to obtain photoresist patterns with a desired CD, the image sharpness of the light-shielding patterns transferred on the photoresist patterns should be increased to reduce the MEEF.

FIG. 2 is a simulation view illustrating an aerial image formed by using a conventional photomask. The simulation was performed by a vector model, and the wavelength of an incident light was 248 nm, and a numerical aperture (NA) was 0.7.

Referring to FIG. 2, photoresist patterns 20a corresponding to the light-shielding patterns 20 of FIG. 1 are formed on a semiconductor substrate 10a. The duty ratio of the light-shielding patterns 20 is high, and the image sharpness of the light-shielding patterns 20 is small so that the longitudinal CD (CDL) of the light-shielding patterns 20 cannot be reduced to less than a predetermined critical dimension. Therefore, the photoresist patterns 20a corresponding to the light-shielding patterns 20 are shortened in the longitudinal axis L so that the longitudinal CD (CDL) of the photoresist patterns 20a is increased.

A method of forming additional light-shielding layers on the light-shielding patterns 20 on the photomask may be employed to reduce the CDL by adjusting the length of the photoresist patterns 20a. However, the CDL can only be reduced to an extent limited by the CD of the additional light-shielding layers.

Further, when the MEEF is high, the formation of additional light-shielding layers cause bridges between the photoresist patterns and result in increased defects of the photoresist patterns.

Accordingly, there is a need for a photomask including patterns repeating in two dimensions that form photoresist patterns having a desired CDL.

SUMMARY OF THE INVENTION

A photomask according to an exemplary embodiment of the invention includes a transparent substrate, a plurality of light-shielding patterns repeatedly aligned over the transparent substrate in two dimensions, and at least one through hole penetrating a predetermined region of each of the light-shielding patterns to expose the transparent substrate. Each of the light-shielding patterns has length and width measurements that differ from each other.

Preferably, the plurality of light-shielding patterns, which are aligned in two dimensions, may have equal length and width measurements.

Further, longitudinal axes of the light-shielding patterns, having equal length and width measurements, may be in parallel.

Further, distances between neighboring light-shielding patterns, aligned in an extension line in each of the longitudinal axes of the light-shielding patterns, may be smaller than the equal length of the light-shielding patterns.

Preferably, the at least one through hole may be located to evenly divide a first longitudinal pitch of the light-shielding patterns, such that a length of a second pitch is proximate to that of a short pitch in a short axes, wherein the first longitudinal pitch is the distance from one center point between a pair of light shielding patterns to another center point between a neighboring pair of light shielding patterns in a longitudinal axes, the second pitch is the length of divided parts of the first longitudinal pitch, and the short pitch is the distance between center points of neighboring light-shielding patterns in the short axes.

A method of forming a photomask according to an exemplary embodiment of the invention comprises forming a light-shielding layer over a transparent substrate. The light-shielding layer is patterned to form a plurality of light-shielding patterns, which are repeatedly aligned in two dimensions, on the transparent substrate. Each of the light-shielding patterns has length and width measurements that differ from each other. At least one through hole is formed on each of the light-shielding patterns penetrating a predetermined region thereof to expose the transparent substrate.

Preferably, the plurality of light-shielding patterns, which are aligned in two dimensions, may have identical length and width measurements.

BRIEF DESCRIPTION OF THE DRAWINGS

Exemplary embodiments of the present invention will be described in detail with reference to the attached drawings in which.

DETAILED DESCRIPTION OF PREFERRED EMBODIMENTS

Figure 1:
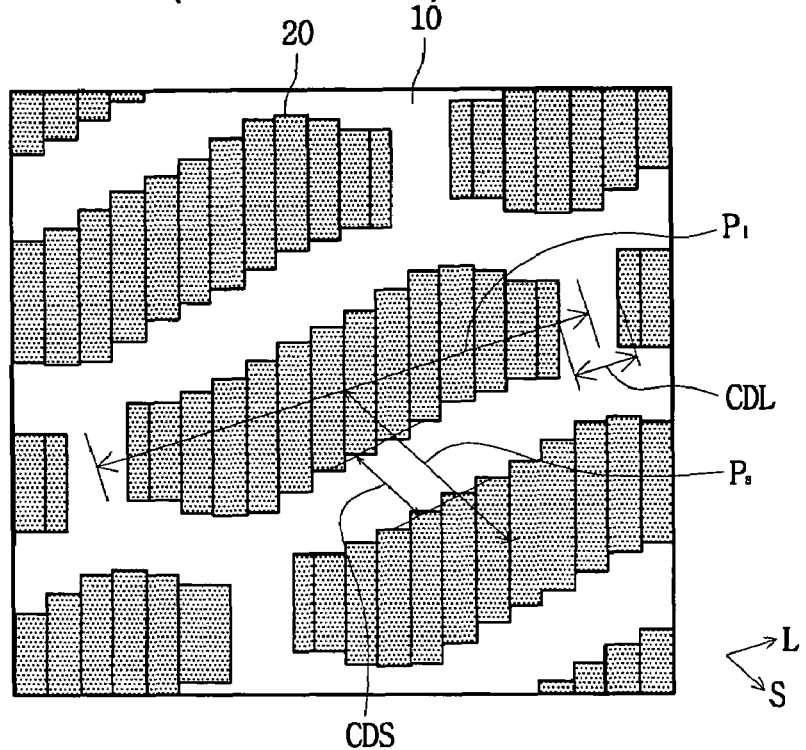
FIG. 1 is a plane view illustrating a conventional photomask for forming patterns repeating in two dimensions.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 3:
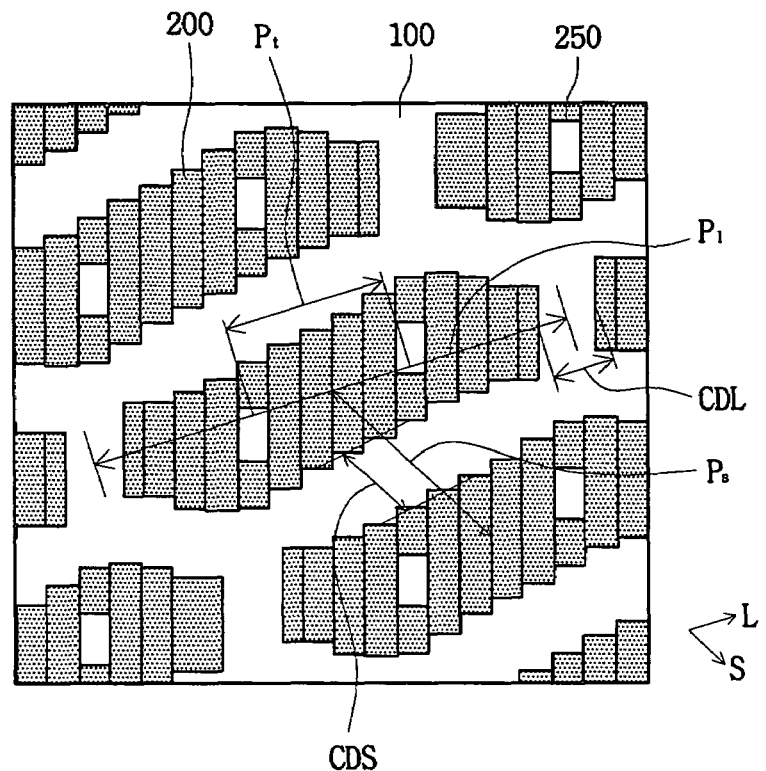
FIG. 3 is a plane view illustrating a photomask according to an embodiment of the present invention.

FIG. 3 is a plane view illustrating a photomask used to form patterns repeating in two dimensions according to an embodiment of the present invention.

Referring to FIG. 3, light-shielding patterns 200 are formed on a transparent substrate 100. The light-shielding patterns 200 are repeatedly aligned on the substrate 100 in two dimensions. Each of the light-shielding patterns 200 has length and width measurements that differ from each other. In each light-shielding pattern 200, the length in the longitudinal axis L is longer than the length in the short axis S.

As shown in FIG. 3, the length measured from a center point between a pair of light-shielding patterns 200 to a center point between a neighboring pair of light-shielding patterns in the longitudinal axis L is defined as a first longitudinal pitch $P_l$. Further, the length measured from a center point of one light-shielding pattern to a center point of an adjacent light-shielding pattern in the short axis S, is defined as a short pitch $P_s$. In all of the light-shielding patterns 200, the first longitudinal pitch $P_l$ is longer than the short pitch $P_s$. Preferably, the first longitudinal pitch $P_l$ in the longitudinal axis L is at least twice as long as the short pitch $P_s$ in the short axis S.

The light-shielding patterns 200 are formed by forming a light-shielding layer on the overall surface of the transparent substrate 100, and patterning the light-shielding layer. The light-shielding layer may be formed of a chrome layer or the like, and be patterned using a photolithography and etching technique or an electron beam scanning technique.

Further, on the light-shielding patterns 200, there are formed through holes 250 penetrating through predetermined regions of the light-shielding patterns 200, and exposing the transparent substrate under the regions. Each of the through holes 250 has a size smaller than a critical dimension so that photoresist patterns corresponding to the through holes 250 can be prevented from being formed. Preferably, each of the through holes 250 has a size less than ¾ the width of the light-shielding pattern 200 through which each of the through holes 250 is formed.

The through holes 250 are evenly spaced along the first longitudinal pitch $P_l$ of the light-shielding patterns 200. Preferably, the centers of the through holes 250 are located on the central lines of the light-shielding patterns 200, which means that the through holes 250 are not necessarily located on the longitudinal axes L of the light-shielding patterns 200. Further, the length defined by dividing the first longitudinal pitch $P_l$ in the longitudinal axis L, is referred to as a second longitudinal pitch $P_t$. Also, the second longitudinal pitch $P_t$ may be defined as a length of parts of the first longitudinal pitch $P_l$ divided by the through holes 250.

Preferably, the through holes 250 are located to divide the first longitudinal pitch $P_l$ in the longitudinal axis by the length equal to the short pitch $P_s$ in the short axis. Thus, the second pitch $P_t$ in the longitudinal axis formed by the through holes 250 has the same length as the short pitch $P_s$ in the short axis. As a result, diffraction angles of the incident light transmitted through the photomask are all equal regardless of the longitudinal or short axis. Therefore, it is easy to select an illumination suitable for an off-axis illumination technique.

In some cases, the length of the first longitudinal pitch $P_l$ in the longitudinal axis L is not appropriate to be divided into portions having lengths equal to the length of the short pitch $P_s$ in the short axis S. That is, the first longitudinal pitch $P_l$ is not an integer multiple of the short pitch $P_s$ in length. In such a case, the through holes 250 may be located to divide the first longitudinal pitch $P_l$ such that the second pitch $P_t$ in the longitudinal axis L is proximate to the length of the short pitch $P_s$ in the short axis.

The through holes 250 that divide the first longitudinal pitch $P_l$ reduce the duty ratio, and improve image sharpness of the light-shielding patterns 200 in the longitudinal axis L. Therefore, pattern formation in the longitudinal axis L becomes much easier.

According to the present embodiment of the invention, there are provided through holes 250 penetrating through predetermined regions of the light-shielding patterns 200 and exposing the transparent substrate 100 so that the duty ratio in the longitudinal axis L is reduced and the image sharpness is improved. Further, the pitch in the longitudinal axis corresponds to the short pitch $P_s$ in the short axis. Thus, selection of an illumination suitable for an off-axis illumination technique is made easier.

EXAMPLE

Figure 4:
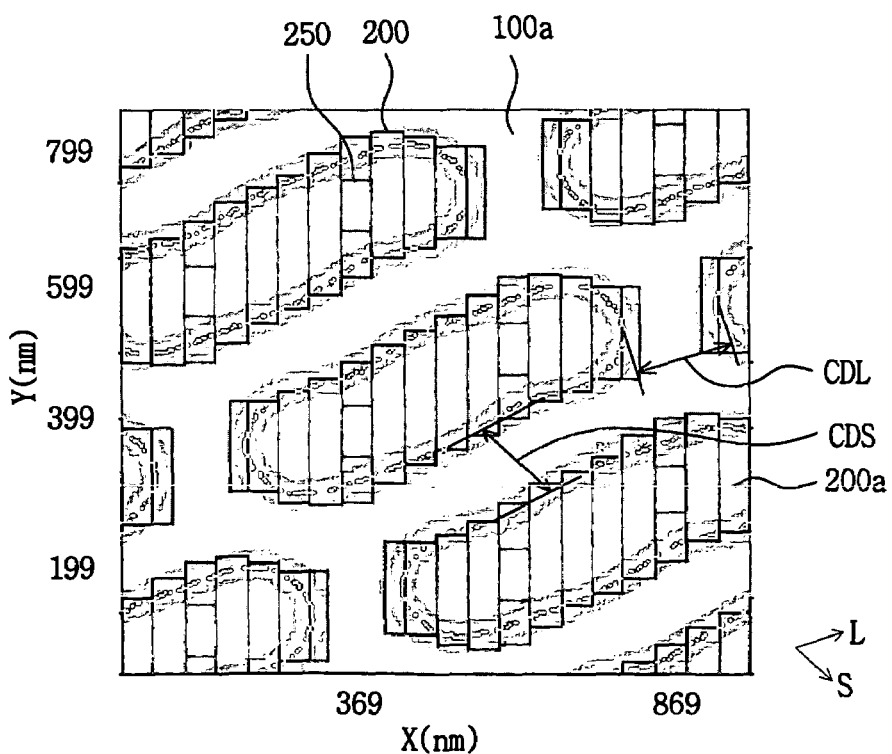
FIG. 4 is a simulation view of photoresist patterns formed by using a photomask according to an embodiment of the present invention.

FIG. 4 is a simulation view of photoresist patterns formed by using the photomask according to an embodiment of the present invention. The simulation used a vector model, and the wavelength of an incident light was 248 nm, and a numerical aperture (NA) was 0.7.

Referring to FIG. 4, photoresist patterns 200a corresponding to the light-shielding patterns 200 of FIG. 3 were formed on a semiconductor substrate 100a. The through holes 250 of FIG. 3 were small enough in size to prevent their formation inside the photoresist patterns 200a. Further, considerable shape distortion was not created around the through holes 250.

Figure 2:
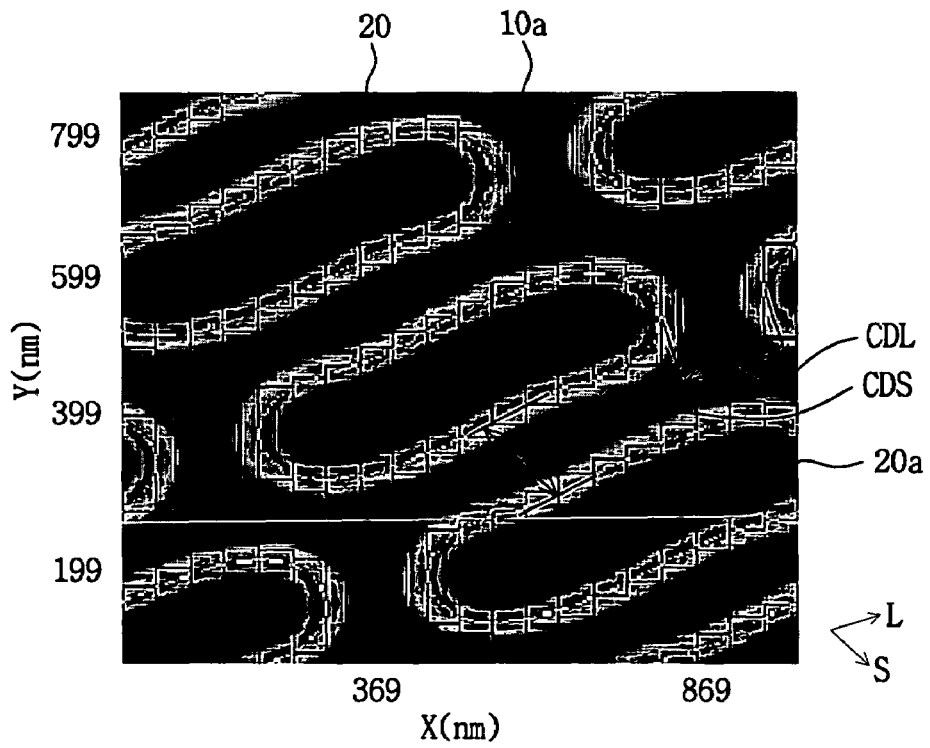
FIG. 2 is a simulation view illustrating an aerial image formed by using a conventional photomask.

Further, in comparison to the simulation result of FIG. 2, the contrast of the photoresist patterns 200a was enhanced, and the longitudinal CD (CDL) was smaller. The comparison data of the simulation result of FIG. 2, and the simulation result of the present embodiment of the invention is shown in Table 1.

Table 1 shows the simulation results of the photoresist patterns formed by using a photomask according to the conventional art, and corresponding photoresist patterns formed by using a photomask according to the present embodiment of the invention.

TABLE 1

| comparison data | conventional photomask | photomask of present embodiment of the invention |
|---|---|---|
| CD in the short axis (CDS) | 136 nm | 136 nm |
| CD in the longitudinal axis (CDL) | 147 nm | 140 nm |
| NILS in the longitudinal axis | 1.18 | 1.35 |
| MEEF in the longitudinal axis | 2.57 | 2.31 |

Referring to Table 1, the CD in the short axis (CDS) was no different between the conventional photomask and the photomask according to the present embodiment of the invention. However, the CD in the longitudinal axis (CDL) formed by the photomask according to the present embodiment of the invention was reduced by 7 nm relative to that formed by the conventional photomask.

Further, the normalized image log slope (NILS), which represents the image sharpness of the photoresist patterns 20a, 200a, was increased by 13% when the photomask according to the present embodiment of the invention was used.

Further, a mask error enhancement factor (MEEF), which represents the rate that the errors on the photomask are magnified on the photoresist patterns, was reduced by 10% when the photomask according to the present embodiment of the invention was used.

Figure 5:
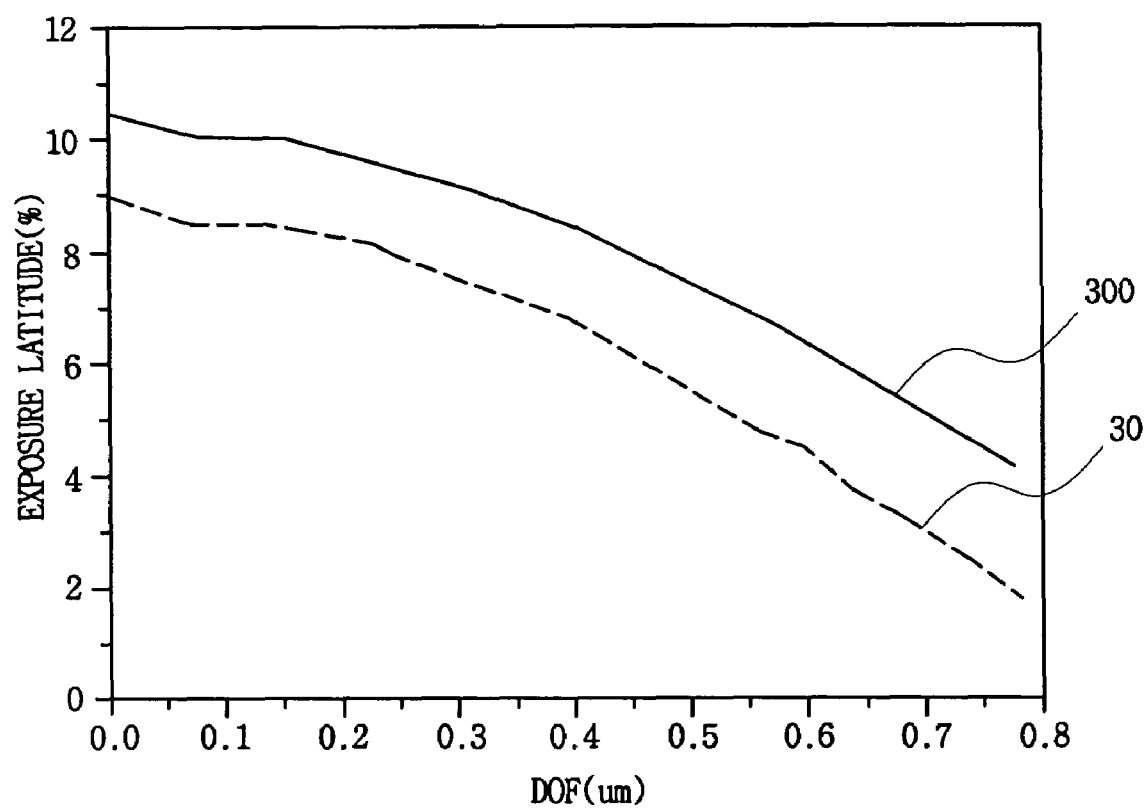
FIG. 5 is a graphical representation of simulation results, including exposure latitude (EL) and depth of focus (DOF), produced by a conventional photomask and a photomask according to an embodiment of the present invention.

FIG. 5 is a graphical representation of the simulation results, including exposure lattitude (EL) and depth of focus (DOF), produced by a conventional photomask and a photomask according to the present embodiment of the invention.

As shown in the simulation results graphed in FIG. 5, the EL and the DOF of the photomask 300 according to the present embodiment of the invention were all improved in comparison to that of the conventional photomask 30.

According to various exemplary embodiments of the present invention, there are provided photoresist patterns, which repeat in two dimensions, that do not exhibit shape distortion and have a desired CD. Further, the photoresist patterns according to various exemplary embodiments of the present invention have improved MEEF, NILS, EL and DOF and increased image sharpness. Further, the photomask according to exemplary embodiments of the invention allows for easier selection of an illumination when an off-axis illumination technique is employed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A photomask comprising:
   a transparent substrate;
   a plurality of light-shielding patterns aligned over the transparent substrate in two dimensions, each of the light-shielding patterns having length and width measurements that differ from each other; and
   at least one through hole penetrating a predetermined region of each of the light-shielding patterns to expose the transparent substrate,
   wherein the at least one through hole has a size smaller than a distance between the light-shielding patterns, wherein the at least one through hole is located to evenly divide a first longitudinal pitch of the light-shielding pattern, wherein the first longitudinal pitch is the distance from one center point between a pair of light shielding patterns to another center point between a neighboring pair of light shielding patterns in a longitudinal axis.

2. The photomask according to claim 1, wherein the plurality of light-shielding patterns, aligned in two dimensions, have equal length and width measurements.

3. The photomask according to claim 2, wherein longitudinal axes of the light-shielding patterns having equal length and width measurements are in parallel.

4. The photomask according to claim 3, wherein distances between neighboring light-shielding patterns, aligned in an extension line in each of the longitudinal axes of the light-shielding patterns, are smaller than the equal length of the light-shielding patterns.

5. The photomask according to claim 1, wherein a first longitudinal pitch of the light-shielding patterns is at least twice as long as a short pitch of the light-shielding patterns in a short axes, wherein the first longitudinal pitch is the distance from one center point between a pair of light shielding patterns to another center point between a neighboring pair of light shielding patterns in each of the longitudinal axes, and the short pitch is the distance between center points of neighboring light-shielding patterns in the short axes.

6. The photomask according to claim 1, wherein a width of the at least one through hole penetrating each of the light-shielding patterns is less than 3/4 the width of the light-shielding pattern penetrated by the through hole.

7. The photomask according to claim 1, wherein a length of a second pitch is proximate to that of a short pitch in a short axes, wherein the second pitch is the length of divided parts of the first longitudinal pitch, and the short pitch is the distance between center points of neighboring light-shielding patterns in the short axes.

8. The photomask according to claim 7, wherein the short pitch is equal to the second pitch.

9. A method of fabricating a photomask comprising the steps of:
   a) forming a light-shielding layer over a transparent substrate;
   b) patterning the light-shielding layer to form a plurality of light-shielding patterns, which are repeatedly aligned in two dimensions on the transparent substrate, each of the light-shielding patterns having length and width measurements that differ from each other; and
   c) forming at least one through hole penetrating a predetermined region of each of the light-shielding patterns to expose the transparent substrate,
   wherein the at least one through hole has a size smaller than a distance between the light-shield patterns,
   wherein the step of forming at least one through hole comprises locating the at least one through hole to evenly divide a first longitudinal pitch of the light-shielding pattern, wherein the first longitudinal pitch is the distance from one center point between a pair of light shielding patterns to another center point between a neighboring pair of light shielding patterns in a longitudinal axis.

10. The method of fabricating a photomask according to claim 9, wherein the plurality of light-shielding patterns, aligned in two dimensions, have identical length and width measurements.

11. The method of fabricating a photomask according to claim 10, wherein longitudinal axes of the light-shielding patterns, having identical length and width measurements, are in parallel.

12. The method of claim 9, wherein the step of forming at least one through hole comprises forming at least one through hole having a width less than 3/4 the width of the light-shielding pattern penetrated by the through hole.

13. The method of claim 9, wherein a length of a second pitch is proximate to that of a short pitch in a short axes, wherein the second pitch is the length of divided parts of the first longitudinal pitch, and the short pitch is the distance between center points of neighboring light-shielding patterns in the short axes.

14. A photomask fabricated by a method comprising:
   a) forming a light-shielding layer over a transparent substrate;
   b) patterning the light-shielding layer to form a plurality of light-shielding patterns, which are repeatedly aligned in two dimensions on the transparent substrate, each of the light-shielding patterns having length and width measurements that differ from each other; and
   c) forming at least one through hole penetrating a predetermined region of each of the light-shielding patterns to expose the transparent substrate,
   wherein the at least one through hole has a size smaller than a distance between the light-shielding patterns,
   wherein the step of forming at least one through hole comprises locating the at least one through hole to evenly divide a first longitudinal pitch of the light-shielding pattern, wherein the first longitudinal pitch is the distance from one center point between a pair of light shielding patterns to another center point between a neighboring pair of light shielding patterns in a longitudinal axis.

15. The photomask according to claim 14, wherein the plurality of light-shielding patterns, aligned in two dimensions, have identical length and width measurements.

16. The photomask according to claim 15, wherein longitudinal axes of the light-shielding patterns, having identical length and width measurements, are in parallel.

17. The photomask according to claim 14, wherein the step of forming at least one through hole comprises forming at least one through hole having a width less than 3/4 the width of the light-shielding pattern penetrated by the through hole.

18. The photomask according to claim 14, wherein a length of a second pitch is proximate to that of a short pitch in a short axes, wherein the second pitch is the length of divided parts of the first longitudinal pitch, and the short pitch is the distance between center points of neighboring light-shielding patterns in the short axes.

* * * * *